United States Patent [19]

Shiraishi et al.

[11] Patent Number: 5,488,326
[45] Date of Patent: Jan. 30, 1996

[54] DATA OUTPUT CIRCUIT FOR SEMICONDUCTOR INTEGRATED CIRCUIT DEVICE WHICH PREVENTS CURRENT FLOW FROM THE OUTPUT TO SUPPLY VOLTAGE

[75] Inventors: Sumako Shiraishi, Kawasaki; Masami Masuda; Kazutaka Nogami, both of Yokohama, all of Japan

[73] Assignee: Kabushiki Kaisha Toshiba, Kanagawa, Japan

[21] Appl. No.: 223,648

[22] Filed: Apr. 6, 1994

[30] Foreign Application Priority Data

Apr. 7, 1993 [JP] Japan .................................. 5-080867

[51] Int. Cl.⁶ .................. H03K 19/0185; H03K 17/687
[52] U.S. Cl. ......................... 327/408; 327/108; 327/389; 326/81
[58] Field of Search .............................. 326/81; 327/108, 327/112, 413, 412, 410, 409, 408, 391, 379, 214, 211, 210, 374, 380, 389, 381, 333

[56] References Cited

U.S. PATENT DOCUMENTS

| | | | |
|---|---|---|---|
| 4,424,456 | 1/1984 | Shiraki et al. | 327/108 |
| 4,506,164 | 3/1985 | Higuchi | 326/81 |
| 4,565,932 | 1/1986 | Kuo et al. | 326/81 |
| 4,697,106 | 9/1987 | Watanabe | 236/81 |
| 4,806,795 | 2/1989 | Nakano et al. | 326/81 |
| 5,013,937 | 5/1991 | Aoki | 326/81 |
| 5,270,589 | 12/1993 | Sawada et al. | 327/537 |
| 5,274,276 | 12/1993 | Casper et al. | 327/537 |
| 5,276,371 | 1/1994 | Jinbo | 327/379 |
| 5,296,801 | 3/1994 | Ohtsuka et al. | 327/537 |

FOREIGN PATENT DOCUMENTS

| | | | |
|---|---|---|---|
| 582767 | 2/1994 | European Pat. Off. | H03K 19/003 |
| 3729926 | 3/1989 | Germany | H01L 27/04 |
| 62-038615 | 2/1987 | Japan | H03K 19/00 |

OTHER PUBLICATIONS

European Search Report dated May 23, 1995, Appl. No. 94105379.5.

Primary Examiner—Timothy P. Callahan
Assistant Examiner—Terry L. Englund
Attorney, Agent, or Firm—Loeb and Loeb

[57] ABSTRACT

A data output circuit includes a P-channel transistor having a source connected to a supply voltage terminal $V_{DD}$ and a gate coupled to receive a drive signal from an internal circuit, and an N-channel transistor having its drain connected to the drain of the P-channel transistor and its source connected to an output terminal $D_{out}$. The threshold voltage of the N-channel transistor is fixed to be lower than the thresholds of other N-channel transistors formed on the same substrate. A high level signal is output from the output terminal $D_{out}$ when a voltage output by the supply voltage terminal $V_{DD}$ is supplied to the output terminal $D_{out}$ through the P-channel transistor and the N-channel transistor. In this configuration; the output terminal charges quickly using the high driving capability of the N-channel transistor. Since the N-channel transistor is interposed along the current path from the output terminal to the supply voltage terminal, current does not flow from the output terminal to the supply voltage terminal when a voltage higher than the supply voltage is applied to the output terminal.

3 Claims, 5 Drawing Sheets

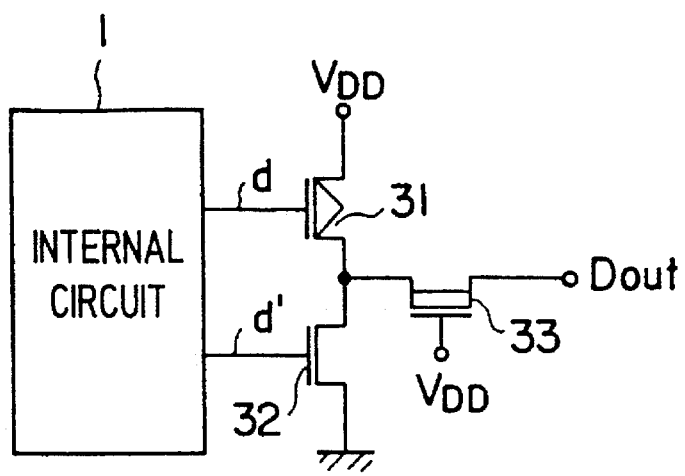
F I G. 1
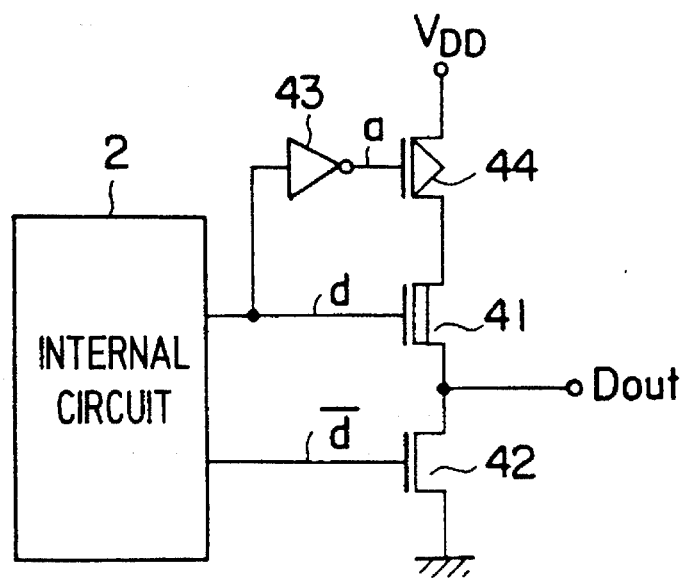
F I G. 2

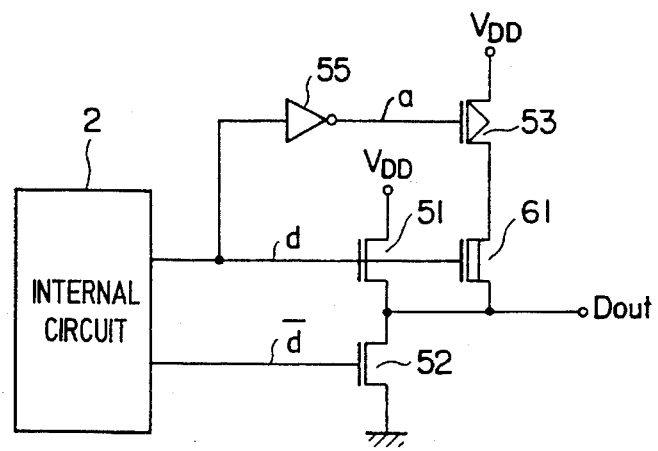
F I G. 5
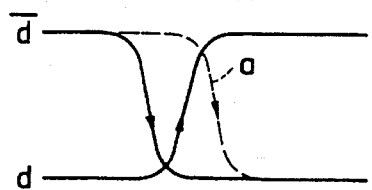
F I G. 6 (a)
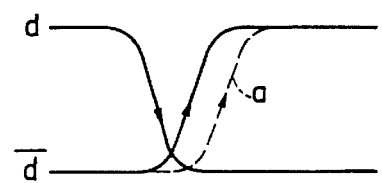
F I G. 6 (b)

5,488,326

DATA OUTPUT CIRCUIT FOR SEMICONDUCTOR INTEGRATED CIRCUIT DEVICE WHICH PREVENTS CURRENT FLOW FROM THE OUTPUT TO SUPPLY VOLTAGE

BACKGROUND OF THE INVENTION

The present invention relates to a data output circuit, and more specifically to a data output circuit suitable for use when driven by a single low voltage supply.

FIG. 7 is a circuit diagram showing a data output circuit related to the present invention. In FIG. 7, an output buffer circuit composed of a P-channel transistor 11 and an N-channel transistor 12 is connected to output terminals of an internal circuit 1 formed in a semiconductor chip. From the internal circuit 1, two same-phase drive signals d and d' are outputted to the gates of the P-channel transistor 11 and the N-channel transistor 12, respectively to drive the output buffer circuit. These transistors 11 and 12 are connected in series between a supply voltage ($V_{DD}$) terminal and a ground voltage ($V_{SS}$) terminal, and the drains of the two transistors 11 and 12 are connected in common to an output terminal $D_{out}$.

When the drive signals d and d' are outputted from the internal circuit 1 to the gates of these two transistors 11 and 12, since any one of the two transistors 11 and 12 is turned on, a high-level or a low-level signal is outputted from the output terminal $D_{out}$.

In this data output circuit, however, when a voltage higher than the supply voltage $V_{DD}$ is applied to the output terminal $D_{out}$, a through current $I_1$ flows from the output terminal $D_{out}$ to the supply voltage ($V_{DD}$) terminal through the P-channel transistor 11.

FIG. 9 is a longitudinal cross-sectional view showing a part of the data output circuit show in FIG. 7. In FIG. 9, an n-type well 72 is formed on the surface of a p-type semiconductor substrate 71, and further a source region 73 and a drain region 74 of P$^+$ type impurity region are formed in the n-type well 72. Here, the above-mentioned through current $I_1$ flows from the output terminal $D_{out}$ into the n-type well 72 through the drain region 74.

Further, in the circuit as shown in FIG. 7, when a high-level signal is outputted, it is necessary to charge the output terminal $D_{out}$ through the P-channel transistor 11. In this circuit, however, since the current drive capability of the P-channel transistor is lower than that of the N-channel transistor, there exists a problem in that the data output speed is lowered.

FIG. 8 is a circuit diagram showing another data output circuit related to the present invention. In FIG. 8, the P-channel transistor 11 shown in FIG. 7 is replaced with an N-channel transistor 21. Therefore, from the internal circuit 1, two opposite-phase drive signals d and /d are outputted to the gates of the N-channel transistor 21 and the N-channel transistor 12, respectively. In the data output circuit as shown in FIG. 8, it is possible to solve the problem related to the through current $I_1$ and the data output speed.

In the data output circuit as shown in FIG. 8, however, the maximum possible high-level output voltage is a voltage obtained by subtracting the threshold voltage of the transistor 21 from the supply voltage $V_{DD}$ applied to the drain of the N-channel transistor 21. Therefore, when a single low-voltage supply (e.g., the supply voltage is as low as $V_{DD}$=3.3 V) is used, it is impossible to obtain a sufficient output level.

In summary, in the data output circuits as described above, when a single low voltage supply is used, there exist problems in that a through current flows or the data output speed is lowered or a sufficient output level cannot be obtained.

SUMMARY OF THE INVENTION

Accordingly, it is the object of the present invention to provide a data output circuit which can output a sufficiently high-level output without generating any through current and without lowering the data output speed.

To achieve the above-mentioned object, the present invention provides a data output circuit which comprises: an internal circuit for outputting a drive signal; a P-channel transistor having a first end connected to a first supply voltage terminal and a gate responsive to the drive signal; and an N-channel transistor having a first end connected to a second end of said P-channel transistor and a second end connected to an external output terminal, and wherein a threshold voltage of said N-channel transistor is determined to be lower than those of other transistors formed on a same substrate; and a high-level signal is outputted from the external output terminal, when a voltage outputted by the first supply voltage terminal is supplied to the external output terminal through said P-channel transistor and said N-channel transistor.

When the high-level signal is outputted from the external output terminal, the voltage outputted by the first supply voltage terminal is supplied to the external output terminal through the P-channel transistor and the N-channel transistor. Therefore, even if a voltage higher than the first supply voltage is applied to the external output terminal, since the N-channel transistor is interposed between the first supply voltage terminal and the external output terminal, it is possible to prevent current from flowing from the external output terminal to the first supply voltage terminal. Further, since the threshold voltage of the N-channel transistor is determined to be lower than those of the other N-channel transistors formed on the same substrate, it is possible to output a sufficiently high-level output signal. Further, when the high-level signal is outputted, since the external output terminal is charged through the N-channel transistor having a current drive capability higher than that of the P-channel transistor, it is possible to charge the output terminal at high speed, with the result that it is possible to prevent the data output speed from being reduced.

BRIEF DESCRIPTION OF THE DRAWINGS

In the attached drawings:

FIG. 1 is a circuit diagram showing a first embodiment of the data output circuit according to the present invention;

FIG. 2 is a Circuit diagram showing a second embodiment of the data output circuit according to the present invention;

FIG. 5 is a circuit diagram showing a fourth embodiment of the data output circuit according to the present invention;

FIGS. 6(a) to (b) are timing charts showing the drive signal waveforms in the fourth embodiment;

DETAILED DESCRIPTION OF THE PREFERRED EMBODIMENTS

Figure 3:
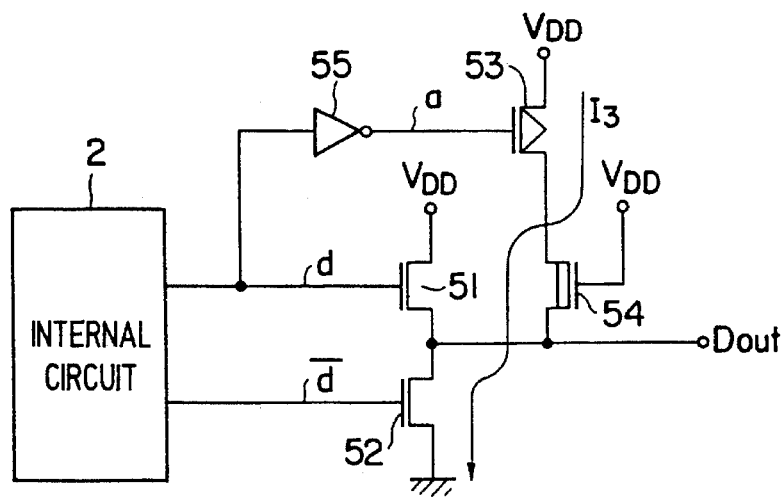
FIG. 3 is a circuit diagram showing a third embodiment of the data output circuit according to the present invention.

Embodiments of the present invention will be described hereinbelow with reference to the attached drawings.

FIG. 1 shows a first embodiment of the data output circuit according to the present invention. As shown, an output buffer circuit composed of a P-channel transistor 31 and two N-channel transistors 32 and 33 is connected to the output side of an internal circuit 1. The P-channel transistor 31 and the N-channel transistor 32 are connected in series between the supply voltage ($V_{DD}$) terminal and the ground voltage ($V_{SS}$) terminal, and two same-phase drive signals d and d' are applied to the gates of these transistors 31 and 32.

The drains of the P-channel transistor 31 and the N-channel transistor 32 are connected to one (first) end of the N-channel transistor 33. The other (second) end of the N-channel transistor 33 is connected to an output terminal $D_{out}$. Here, a supply voltage $V_{DD}$ is applied to the gate of the N-channel transistor 33, and the threshold voltage of this transistor 33 is determined to be lower than that of the N-channel transistor 32.

When the drive signals d and d' outputted by the internal circuit 1 change from a high-level to a low-level, the P-channel transistor 31 is turned from off to on, and the N-channel transistor 32 is turned from on to off. Further, the N-channel transistor 33 is normally turned on. Accordingly, the high-level signal is charged from the supply voltage ($V_{DD}$) terminal to the output terminal $D_{out}$ through the P-channel transistor 31 and the N-channel transistor 33, so that a signal can be outputted. Here, since the threshold voltage of the N-channel transistor 33 is determined lower, even if the supply voltage is as low as 3.3 V, it is possible to obtain a sufficiently high-level signal at the output terminal $D_{out}$.

Further, since the drain of the P-channel transistor 31 is connected to the output terminal $D_{out}$ through the N-channel transistor 33, even if a voltage higher than the supply voltage $V_{DD}$ is applied to the output terminal $D_{out}$, it is possible to prevent current from flowing from the output terminal $D_{out}$ to the supply voltage ($V_{DD}$) terminal or from the output terminal $D_{out}$ to the semiconductor substrate through the drain region of the P-channel transistor 31.

FIG. 2 shows a second embodiment of the data output circuit according to the present invention. As shown, a P-channel transistor 44 and two N-channel transistors 41 and 42 are connected in series between the supply voltage ($V_{DD}$) terminal and the ground voltage ($V_{SS}$) terminal. Two opposite-phase drive signals d and /d are applied to the gates of these N-type transistors 41 and 42 from an internal circuit 2. Further, the drive signal d is inverted by an inverter 43, and then the inverted drive signal /d is applied to the gate of the P-channel transistor 44 via a node a. Here, the threshold voltage of the N-channel transistor 41 is determined to be lower than that of the N-channel transistor 42.

When the drive signal d is at a high-level, since the drive signal d is inverted by the inverter 43 and then applied to the node a, the P-channel transistor 44 and the N-channel transistor 41 are both turned on, so that the high-level signal can be outputted from the output terminal $D_{out}$. In this case, since the threshold voltage of the N-channel transistor 41 is determined low, it is possible to output a sufficiently high-level signal from the output terminal $D_{out}$.

In the case of the first embodiment shown in FIG. 1, the high-level signal can be outputted, because the output terminal $D_{out}$ can be charged through the P-channel transistor 31 and the N-channel transistor 33. Further, the low-level signal can be outputted, because the output terminal $D_{out}$ can be discharged through the N-channel transistor 33 and the N-channel transistor 32. In other words, charge and discharge are necessary to output data from the output terminal $D_{out}$.

In comparison with the first embodiment, in the case of the second embodiment shown in FIG. 2, since the low-level signal can be outputted by discharging the output terminal $D_{out}$ through only the N-channel transistor 42, it is possible to increase the data output speed.

Further, in this second embodiment, it is possible to obtain the same effect as with the case of the first embodiment. That is, since the threshold voltage of the N-channel transistor 41 is determined low, when the high-level signal is outputted from the output terminal $D_{out}$, it is possible to obtain a sufficient signal level.

Further, since the drain of the P-channel transistor 44 is connected to the output terminal $D_{out}$ through the N-channel transistor 41, even if a voltage higher than the supply voltage $V_{DD}$ is applied to the output terminal $D_{out}$, it is possible to prevent current from flowing from the output terminal $D_{out}$ to the supply voltage ($V_{DD}$) terminal or from the output terminal $D_{out}$ to the semiconductor substrate through the drain region of the P-channel transistor 44.

FIG. 3 shows a third embodiment of the data output circuit according to the present invention. As shown, two N-channel transistors 51 and 52 are connected in series between the supply voltage ($V_{DD}$) terminal and the ground voltage ($V_{SS}$) terminal. Two opposite-phase drive signals d and /d are applied to the gates of these N-type transistors 51 and 52 from an internal circuit 2. Further, a P-channel transistor 53 and an N-channel transistor 54 are connected in series between the supply voltage ($V_{DD}$) terminal and the output terminal $D_{out}$. The drive signal d is inverted by an inverter 55, and then the inverted drive signal /d is applied to the gate of the P-channel transistor 53 via a node a. Further, the supply voltage $V_{DD}$ is applied to the gate of the N-channel transistor 54.

When the N-channel transistor 51 is turned on in response to the drive signal d and thereby the output terminal $D_{out}$ is charged, the high-level signal can be outputted. When only the N-channel transistor 51 is charged, the maximum level of the high-level output signal corresponds to a value obtained by subtracting the threshold voltage of the N-channel transistor 51 from the supply voltage $V_{DD}$. In this embodiment, however, since the P-channel transistor 53 can be turned on when the low-level signal is applied to the gate thereof, it is possible to charge the output terminal $D_{out}$ through the turned-on transistor 53 and the normally turned-on N-channel transistor 54. Further, since the threshold voltage of the N-channel transistor 54 is determined low, it is possible to output a sufficiently high-level signal from the output terminal $D_{out}$. Further, since the output terminal $D_{out}$ can be charged through the N-channel transistor 51 (having a current drive capability higher than that of the P-channel transistor), it is possible to output the high-level data at high speed.

Figure 4A:
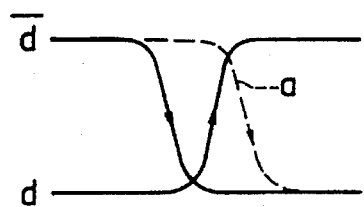
FIGS. 4(a) to (c) are timing charts showing the drive signal waveforms in the third embodiment.

FIG. 4(a) shows timing waveforms of the drive signals d and /d and a potential applied to the node a (the gate of the P-channel transistor 53). In FIG. 4(a), the drive signal d changes from the low level to the high level, and the drive signal /d changes from the high level to the low level. In this case, the potential at the node a is inverted being delayed from the drive signal d by a predetermined delay time.

Figure 4B:
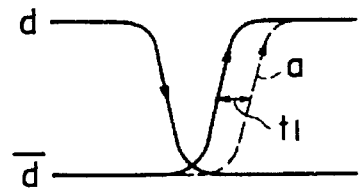
Figure 4C:
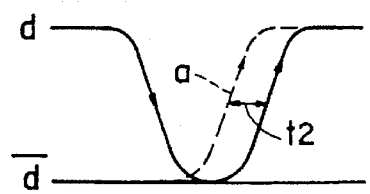
Figure 7:
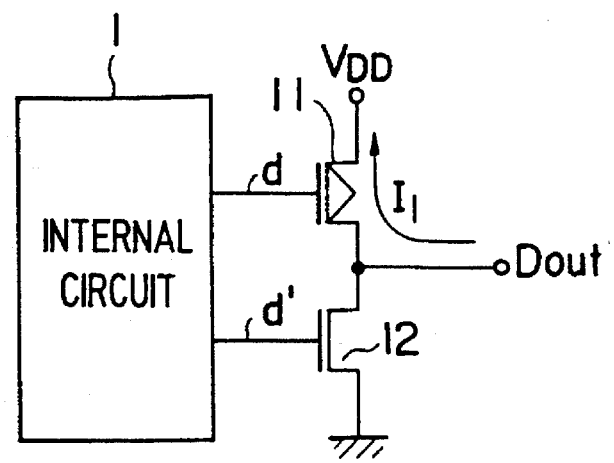
FIG. 7 is a circuit diagram showing a conventional data output circuit related to the present invention.
Figure 8:
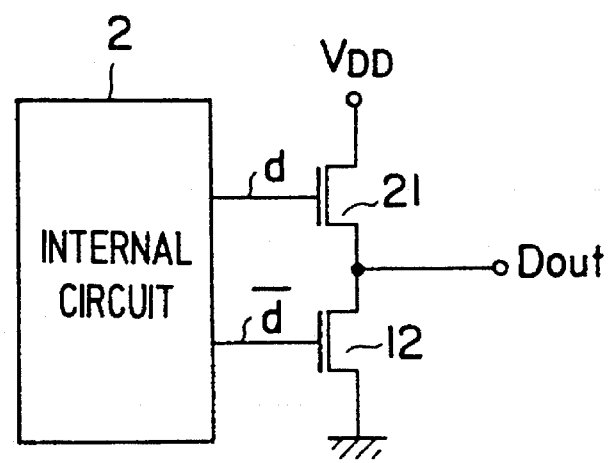
FIG. 8 is a circuit diagram showing another conventional data output circuit related to the present invention.
Figure 9:
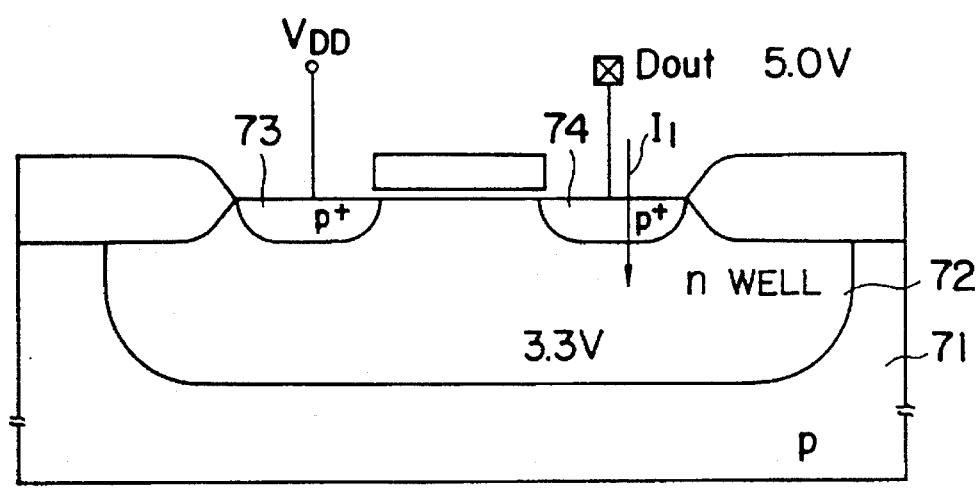
FIG. 9 is a longitudinal cross-sectional view showing the element structure of the conventional data output circuit shown in FIG. 7.

FIG. 4(b) shows timing waveforms of when the drive signal d changes from the high level to the low level and the drive signal /d changes from the low level to the high level. In this case, after the drive signal d changes to the low level to turn off the N-channel transistor 51, the potential at the node a changes to the high level. Further, before the P-channel transistor 53 is turned off, the N-channel transistor 52 is turned on. Therefore, a through current $I_3$ flows from the supply voltage ($V_{DD}$) terminal through the P-channel transistor 53 and the N-channel transistors 54 and 52 during a time period $t_1$ shown in FIG. 4(b). To prevent the above-mentioned through current $I_3$, it is necessary to set a timing margin so that after the potential at the node a has risen to the high level, the drive signal d rises to the high level, as shown in FIG. 4(c). However, it is rather difficult to set the above-mentioned margin from the standpoint of circuit dimensions, so that the data output speed is inevitably lowered.

FIG. 5 shows a fourth embodiment which can prevent the through current flowing in the third embodiment. Being different from the third embodiment, this fourth embodiment is characterized in that the N-channel transistor 54 shown in FIG. 3 is replaced with an N-channel transistor 61 and further the drive signal d is inputted to the gate of this transistor 61.

FIGS. 6(a) and (b) show the timing waveforms in the fourth embodiment. As shown in FIG. 6(a), when the drive signal d is at the low level and the drive signal /d is at the high level, the potential at the node a is at the high level. Accordingly, the N-channel transistors 51 and 61 and the P-channel transistor 53 are all turned off, and the N-channel transistor 52 is turned on, so that the low-level signal is outputted from the output terminal $D_{out}$. When the drive signal d changes to the high level and the drive signal /d changes to the low level, since the potential at the node a changes to the low level, the N-channel transistor 52 is turned off and the other transistors are all turned on, so that the high-level signal can be outputted. Here, in the same way as with the case of the N-channel transistor 54 of the third embodiment, since the threshold voltage of the N-channel transistor 61 is determined lower than those of the other transistors, it is possible to output a sufficiently high-level signal.

Thereafter as shown in FIG. 6(b), when the drive signal d changes from the high level to the low level and the drive signal /d changes from the low level to the high level, the potential at the node a changes from the low level to the high level. Accordingly, the N-channel transistors 51 and 61 and the P-channel transistor 53 are all turned off, and the N-channel transistor 52 is turned on, so that the low-level signal is outputted from the output terminal $D_{out}$. In this case, since the N-channel transistor 61 is first turned off before the N-channel transistor 52 is turned on, it is possible to prevent through current from flowing from the supply voltage ($V_{DD}$) terminal to the ground voltage ($V_{SS}$) terminal through the transistors 53, 61 and 52. Accordingly, in this fourth embodiment, being different from the third embodiment, it is unnecessary to set the timing so that after the potential at the node a has changed from the low level to the high level, the drive signal /d is changed from the low level to the high level. In other words, in this embodiment, it is possible to determine the circuit dimensions freely and further to increase the data output speed.

The above-mentioned embodiments are described only by way of examples. Therefore, the present invention can be modified in various ways, without being limited to only the circuits as shown in FIGS. 1 to 3 and 5. For instance, it is unnecessary to output two complementary drive signals from the internal circuit as described in the respective embodiments. The internal circuit for outputting a single drive signal can be used. In this case, inverting means such as an inverter is connected externally to the internal circuit to obtain an inverted drive signal. Further, the circuit configuration of the internal circuit is not restricted; that is, any internal circuits can be used, as far as at least one drive signal is outputted to drive the transistor connected to the output stage.

What is claimed is:

1. A data output circuit, comprising:

an internal circuit for outputting a first drive signal and a second drive signal;

a P-channel transistor having a first end connected to a first supply voltage terminal and a gate receiving a signal obtained by inverting the first drive signal;

a first N-channel transistor having a first end connected to a second end of said P-channel transistor, a second end connected to an external output terminal, and a gate receiving the first drive signal; and a second N-channel transistor having a first end connected to the external output terminal, a second end connected to a second supply voltage terminal, and a gate receiving the second drive signal, wherein a threshold voltage of said first N-channel transistor is lower than that of said second N-channel transistor, and when the first drive signal becomes high level and the second drive signal becomes low level, said P-channel transistor and said first N-channel transistor are turned on and said second N-channel transistor is turned off, so that a high-level voltage supplied from the first supply voltage terminal is outputted to the external output terminal through said P-channel transistor and said first N-channel transistor.

2. A data output circuit for a semiconductor integrated circuit device comprising:

an internal circuit for outputting a first drive signal and a second drive signal;

a first N-channel transistor having a first end connected to a first supply voltage terminal, a second end connected to an external output terminal, and a gate receiving the first drive signal from said internal circuit;

a second N-channel transistor having a first end connected to the external output terminal, a second end connected to a second supply voltage terminal, and a gate receiving the second drive signal from said internal circuit;

a P-channel transistor having a first end connected to the first supply voltage terminal and a gate receiving a signal obtained by inverting the first drive signal; and a third N-channel transistor having a first end connected to a second end of said P-channel transistor, a second end connected to the external output terminal, and a gate connected to the first supply voltage terminal, wherein a threshold voltage of said third N-channel transistor is lower than those of said first and second N-channel transistors, and when the first drive signal becomes high level and the second drive signal becomes low level, said first N-channel transistor and P-channel transistor are turned on and said second N-channel transistor is turned off, and said third N-channel transistor is in an on-state, so that a high-level voltage supplied from the first supply voltage terminal is output to the external output terminal through said first N-channel transistor, and a voltage at the external output terminal is raised by said P-channel transistor and said third N-channel transistor.

3. A data output circuit for a semiconductor integrated circuit device comprising:

an internal circuit for outputting a first drive signal and a second drive signal;

a first N-channel transistor having a first end connected to a first supply voltage terminal, a second end connected to an external output terminal, and a gate receiving the first drive signal from said internal circuit;

second N-channel transistor having a first end connected to the external output terminal, a second end connected to a second supply voltage terminal, and a gate receiving the second drive signal from said internal circuit;

a P-channel transistor having a first end connected to the first supply voltage terminal and a gate receiving a signal obtained by inverting the first drive signal; and a third N-channel transistor having a first end connected to a second end of said P-channel transistor, a second end connected to the external output terminal, and a gate receiving the first drive signal, wherein a threshold voltage of said third N-channel transistor is lower than those of said first and second N-channel transistors, and when the first drive signal becomes high level and the second drive signal becomes low level, said first and third N-channel transistors and P-channel transistor are turned on and said second N-channel transistor is turned off, so that a high-level voltage supplied from the first supply voltage terminal is output to the external output terminal through said first N-channel transistor, and a voltage at the external output terminal is raised by said P-channel transistor and said third N-channel transistor.

* * * * *